(12) United States Patent
de Haas et al.

(10) Patent No.: US 11,038,508 B2
(45) Date of Patent: Jun. 15, 2021

(54) CONTROLLER AREA NETWORK (CAN), CAN DEVICE AND METHOD THEREFOR

(71) Applicant: NXP B.V., Eindhoven (NL)

(72) Inventors: Clemens de Haas, Ewijk (NL); Matthias Muth, Stelle (DE)

(73) Assignee: NXP B.V., Eindhoven (NL)

( * ) Notice: Subject to any disclaimer, the term of this patent is extended or adjusted under 35 U.S.C. 154(b) by 24 days.

(21) Appl. No.: 16/777,883

(22) Filed: Jan. 30, 2020

(65) Prior Publication Data

US 2020/0252066 A1  Aug. 6, 2020

(30) Foreign Application Priority Data

Feb. 4, 2019 (EP) .................... 19155260

(51) Int. Cl.
| | |
|---|---|
| *H04L 25/02* | (2006.01) |
| *H03F 3/26* | (2006.01) |
| *H03K 19/00* | (2006.01) |
| *H04L 12/40* | (2006.01) |
| *H03M 9/00* | (2006.01) |
| *H04B 1/38* | (2015.01) |

(52) U.S. Cl.
CPC .......... *H03K 19/0005* (2013.01); *H03F 3/26* (2013.01); *H03M 9/00* (2013.01); *H04B 1/38* (2013.01); *H04L 12/40013* (2013.01); *H04L 25/028* (2013.01); *H04L 25/0262* (2013.01); *H04L 25/0272* (2013.01); *H03F 2200/387* (2013.01); *H04L 2012/40215* (2013.01)

(58) Field of Classification Search
CPC . H03K 19/0005; H03F 3/26; H03F 2200/387; H04L 25/0272; H04L 2012/40215
See application file for complete search history.

(56) References Cited

U.S. PATENT DOCUMENTS 8,593,202 B2  11/2013  Mori et al.
9,973,348 B2   5/2018  Mounier et al.
(Continued)

FOREIGN PATENT DOCUMENTS

| DE | 10 2010 004 348 A1 | 7/2011 |
|---|---|---|
| EP | 3 373 526 A1 | 12/2018 |
| EP | 3 445 003 A1 | 2/2019 |

*Primary Examiner* — Jason Crawford
(74) *Attorney, Agent, or Firm* — Rajeev Madnawat

(57) ABSTRACT

A Controller Area Network, CAN, device, (400) is described that includes: a CAN transmitter (430) connected to two CAN bus terminals (401, 402) of the CAN device (400); a receiver circuit (450) operably coupled to the two CAN bus terminals (401, 402) of the CAN device (400); and a controller (432) connected to the CAN transmitter (430). The controller (432) is configured to: determine whether the CAN device (400) is operating as a transmitter node or a receiver node; detect a transition of the CAN device (400) from a dominant state to a recessive state; and in response to detecting both a transition of the CAN device (400) from the dominant state to the recessive state, and the determination of whether the CAN device (400) is operating as a transmitter node or a receiver node, control an output impedance of the CAN transmitter (430) to be within an impedance value range whilst a differential driver voltage on a CAN bus (104, 304, 404) connected to the CAN device (400) decreases to a predefined voltage.

15 Claims, 10 Drawing Sheets

(56) References Cited

U.S. PATENT DOCUMENTS

| | | | |
|---|---|---|---|
| 10,020,841 B2 | 7/2018 | De Haas et al. | |
| 2010/0124298 A1 | 5/2010 | Jang | |
| 2014/0156893 A1* | 6/2014 | Monroe | G06F 13/372 |
| | | | 710/117 |
| 2016/0036604 A1 | 2/2016 | Mori et al. | |
| 2016/0342531 A1* | 11/2016 | Sharma | G06F 12/1408 |
| 2017/0093659 A1* | 3/2017 | Elend | H04L 43/08 |
| 2017/0257140 A1* | 9/2017 | De Haas | H03K 5/1534 |
| 2017/0262394 A1* | 9/2017 | De Haas | G06F 13/4282 |
| 2019/0058614 A1* | 2/2019 | de Haas | H04L 12/417 |
| 2019/0089559 A1* | 3/2019 | Isomura | B60R 16/023 |

* cited by examiner

US 11,038,508 B2

CONTROLLER AREA NETWORK (CAN), CAN DEVICE AND METHOD THEREFOR

CROSS-REFERENCE TO RELATED APPLICATIONS

This application claims the priority under 35 U.S.C. § 119 of European patent application no. 19155260.3, filed on Feb. 4, 2019, the contents of which are incorporated by reference herein.

FIELD OF THE INVENTION

The field of the invention relates to a controller area network (CAN), a CAN device and a method for ringing suppression, for example to improve slower CAN FD baud rates. In particular, the field of the invention relates to a transceiver of a CAN device with feedforward and feedback impedance control that can be used to suppress ringing.

BACKGROUND OF THE INVENTION

The Controller Area Network (CAN) bus is a multi-master serial bus that connects one or more nodes in a network and is often used in automotive and industrial automation applications. Use of the CAN bus is governed by various ISO standards, for example ISO11898-1 for the CAN protocol, ISO 11898-2 for high speed CAN Physical Layer and ISO 11898-3 for low speed or fault tolerant CAN Physical Layer. A CAN bus is able to support bit-rates up to 1 Mb/s in case of classic CAN, and bit-rates up to 8 Mb/s in case of CAN flexible data rate (CAN FD) when the network topology is ideally terminated.

The theoretical speed can only be met if the proper termination resistance (120 Ohm) is present at the end-nodes of the network and intermediate nodes connected to the bus via stubs are of a sufficiently short length. The termination is there to prevent reflections on the bus that may distort or compromise the integrity of the signalling on the bus. The nodes that are furthest from the terminating resistors may cause a signal reflection when one of the nodes transmits, which may cause ringing on the bus. This 'ringing' may reduce the maximum data rate at which the bus may operate correctly. Traditionally, other factors, such as the length of the bus cable, may also limit the data rate to a speed below the speed at which ringing would become an issue. However, advancements in the CAN bus protocol, for example the CAN bus flexible data rate (CAN FD), have increased the possible data rate to a point at which ringing becomes influential and problematic.

Some known techniques have proposed a feedforward ringing suppression concept. However, a disadvantage of a feedforward ringing suppression concept is a balancing between having only one-device to support all CAN FD baud-rates and achieving an optimum ringing suppression performance at lower CAN FD baud-rates ($\leq 2$ Mbps). The feedforward concept has the fastest response time on the dominant to recessive transition of signals on the CAN bus and is used to support the highest CAN FD baud-rates and error frame detection. A feedforward concept has only one ringing suppression device that is active during the data-phase transmission. Due to this behaviour there is a potential performance penalty with network topologies, which are badly designed, for example, such as equal cable wire length sections that cause colliding reflections. A single transmitter is not able to drive the bus low ohmic enough to counteract these colliding signal reflections effectively over all the topology.

Some known techniques (e.g. U.S. Pat. No. 8,593,202) have proposed a feedback ringing suppression concept. However, the ringing suppression circuit can be triggered unintentionally on disturbances on the CAN bus, thereby resulting in corrupted CAN data communication. Due to the reactive nature of a feedback concept the response time on the dominant to recessive transition is slow, thereby limiting the maximum baud-rate ($\leq 2$ Mbps) and they require a fixed timing characteristic of the ringing suppression circuit

SUMMARY OF THE INVENTION

The present invention provides a controller area network (CAN), a CAN device and a method for suppressing ringing, as described in the accompanying claims.

Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
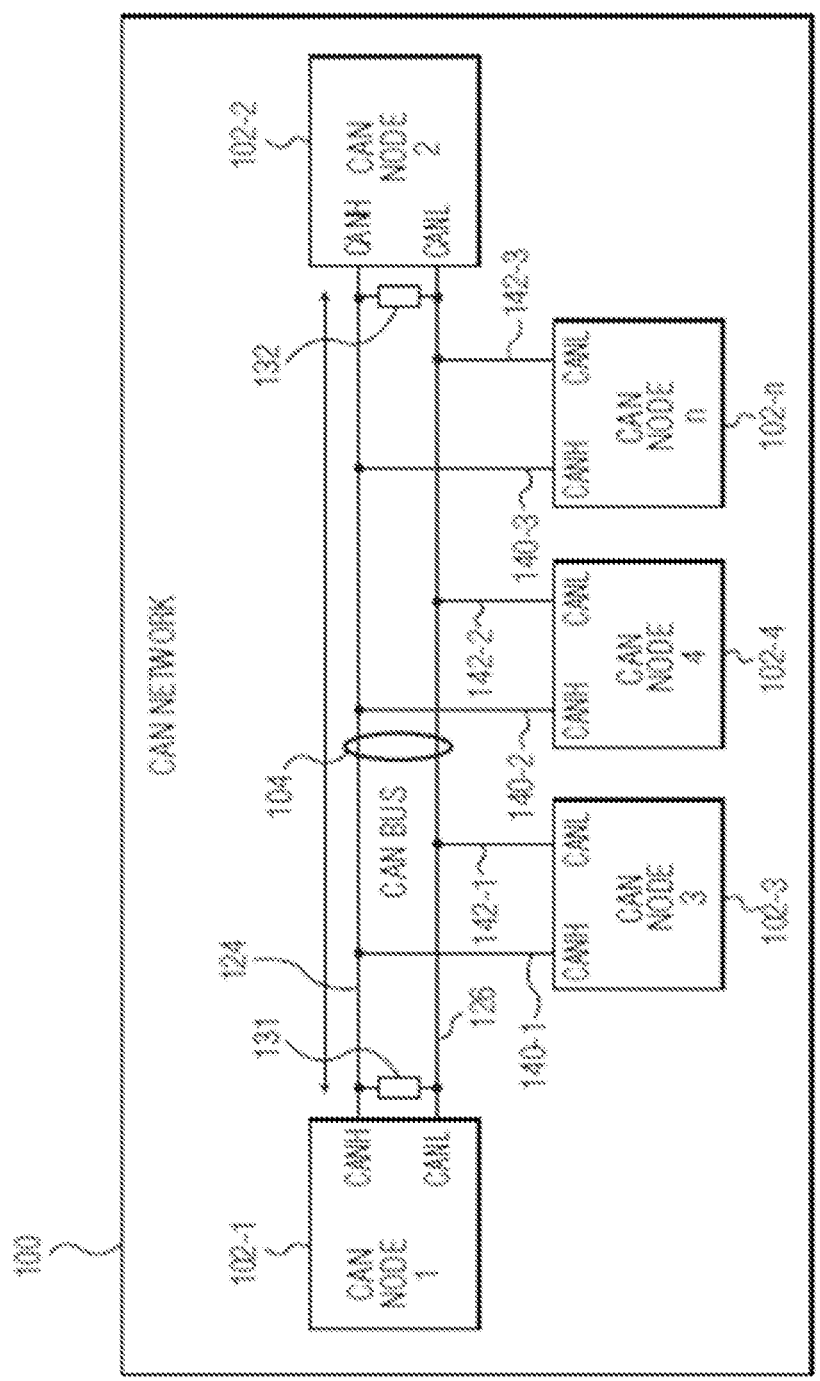
FIG. 1 schematically illustrates a block diagram of an example of a CAN bus network with multiple nodes according to an example of the present invention.

A recently proposed CAN system employs a feedback architecture for ringing suppression. One problem with such feedback architecture is that from a system point of view it is less predictable, and the architecture has to rely on filtering in order to prevent false triggering. In accordance with some example embodiments of the present invention an approach that combines both a feedforward and feedback concept is described, which alleviates or prevents false triggering. In this manner, it is possible for a CAN system to exhibit the best ringing suppression performance of both concepts, for example at lower CAN and CAN FD baudrates.

In accordance with some example embodiments of the present invention, there is provided a Controller Area Network, CAN, device, that includes: a transmitter, for example an impedance bridge, connected to two CAN bus terminals of the CAN device; a receiver circuit operably coupled to the two CAN bus terminals of the CAN device; and a controller, for example an impedance controller connected to the transmitter. The controller is configured to: determine whether the CAN device is operating as a transmitter node or a receiver node; detect a transition of the CAN device from a dominant state to a recessive state; and in response to both detecting a transition of the CAN device from the dominant state to the recessive state, and the determination of whether the CAN device is operating as a transmitter node or a receiver node, control an output impedance of the transmitter to be within a first predefined range of an impedance value at the dominant state whilst a differential driver voltage on a CAN bus connected to the CAN device decreases to a second predefined voltage. Since the driver output impedance stay's constant with respect to the first predefined range of an impedance value at the dominant state during the transition to the second predefined voltage, the energy step into the network is minimized and this results in a smaller reflection. In this manner, by the controller configuring the transmitter according to the CAN device operating as a transmitter or a receiver, the inventors have recognised that the CAN device is able to benefit from the advantages of both a feedforward ringing suppression approach as well as a feedback ringing suppression approach via the receiver. The benefit of having a CAN device that also operates as a feedback ringing suppression is that in a large network (e.g. where there exists long distances between nodes and a large number of nodes) these CAN devices all work in parallel in order to suppress the ringing. This is compared to a known CAN device with only feedforward ringing suppression (where only one transmitting CAN device is actively able to perform ringing suppression during the CAN data-phase), and when the longest distance between nodes incurs a propagation delay longer (typical 5 nsec/m) than the active suppression time. Here, the ringing suppression becomes less effective. hence, examples of the invention incorporate an approach that benefits from some of the advantages of feedforward ringing suppression, but additionally introduces feedback ringing suppression because each node in the network is able to participate in ringing suppression.

According to some examples of the invention, the controller may be an impedance controller and the transmitter may be an impedance bridge. According to some examples of the invention, the impedance controller may be connected to the CAN transmitter and configured to provide a control of the output impedance of the impedance bridge to be within the first predefined range in a feedforward manner when the CAN device is operating as a transmitter node and configured to provide a control of the output impedance of the impedance bridge (430) to be within a second predefined range when the CAN device is operating as a receiver node. According to some examples of the invention, the impedance bridge may comprises two legs, and wherein each of the two legs may comprise an adjustable pull circuit and an adjustable push circuit connected in series between a common voltage supply rail and a common ground rail and to each of the two CAN bus terminals. According to some examples of the invention, the controller may be further configured to: increase the output impedance of the CAN transmitter to be to be within a threshold of a range of a characteristic impedance of the CAN bus, for example ±10% characteristic impedance of the CAN bus and preferably substantially equal to a characteristic impedance of the CAN bus, whilst the differential driver voltage on the CAN bus may be maintained at the predefined voltage level; and subsequently, increase the output impedance of the CAN transmitter from the characteristic impedance of the CAN bus to a high ohmic value whilst the differential driver voltage on the CAN bus is maintained at the predefined voltage level. According to some examples of the invention, the controller may be further configured to increase the output impedance of the CAN transmitter to be within the first predefined impedance value range of a characteristic impedance of the CAN bus before a data sample point whilst a differential driver voltage on the CAN bus is maintained at the predefined voltage level. According to some examples of the invention, the CAN device may include a time window filter circuit operably coupled to the receiver circuit and the controller and configured to determine whether the CAN bus voltage had been above a threshold for a period of time, and in response thereto provide an indication to the controller that the CAN device is operating as a receiver node. According to some examples of the invention, the time window filter circuit may be further configured to filter noise from a receive data signal from the receiver circuit. According to some examples of the invention, the time window filter circuit may be a window logic circuit coupled to a bit timing logic circuit and configured to reject an output of the receiver circuit other than for a dominant to recessive transition. According to some examples of the invention, the CAN device may further include at least one of: a baudrate detector circuit configured to measure a bit rate employed by the CAN device and provide the measured bit rate to the controller; and a serial-to-parallel interface, SPI, configured to provide a predetermined employed bit rate to the controller.

Referring now to FIG. 1, an illustrative example of a network 100 comprising a plurality of nodes coupled together via a CAN bus is shown according to an example of the present application. The network 100 comprises a plurality of nodes exemplified by a first node 102-1, a second node 102-2, a third node 102-3, for example an $(n-1)^{th}$ node 102-4 and an $n^{th}$ node 102-n. The nodes 102-1 to 102-n are coupled together for communication by a bus 110. Herein the bus is exemplified as a CAN bus 104, implemented in form of a two-wire bus comprising a CANH wire 124 and a CANL wire 126. In this case, the wires 124 and 126 form a single twisted-pair cable having a nominal cable impedance. Each of the nodes 102-1 to 102-5 is coupled to the CANH wire 124 and CANL wire 126 via tap lines. In this example the nominal cable impedance is 120Ω, which is typical of some automotive applications of the CAN bus. It will however be appreciated that embodiments are applicable to other line impedances and the present application should not be understood to be limited to a specific nominal cable impedance. It will also be appreciated that the exact impedance of the line may be affect by physical factors such as the cable and/or isolation material used. Whilst the line impedance is assumed to be 120Ω, the actual line impedance may vary around this value and can be considered to be approximately 120Ω. Similarly, termination resistors may vary as to their exact value, for example due to real-world implementation.

The first node 102-1 is a first end node of the CAN bus 104 and has a termination resistance $R_{Term}$ 131 corresponding to the nominal cable impedance such as 120Ω. The second node 102-2 is a second end node and has a termination resistance $R_{Term}$ 132 corresponding to the nominal cable impedance such as 120Ω. The third, $(n-1)^{th}$ node and $n^{th}$ node are intermediate nodes and are coupled to the CAN bus 104 via stubs or tap lines 140-1,142-1, 140-2,142-2 and 140-3,142-3. Such intermediate nodes may be unterminated or optionally applied with a high ohmic termination in the kilo-ohms range in some systems. In some examples, high ohmic termination may provide limited ringing suppression at these quasi open ends of the cable, but the effectiveness is very limited due to the deviation from the nominal cable impedance.

Each of the nodes may be coupled to further circuitry, such as sensors or microcontrollers, that may be configured to communicate with one or more of the other nodes using the CAN bus 104.

A skilled artisan will appreciate that the level of integration of circuits or components may be, in some instances, implementation-dependent.

Figure 2:
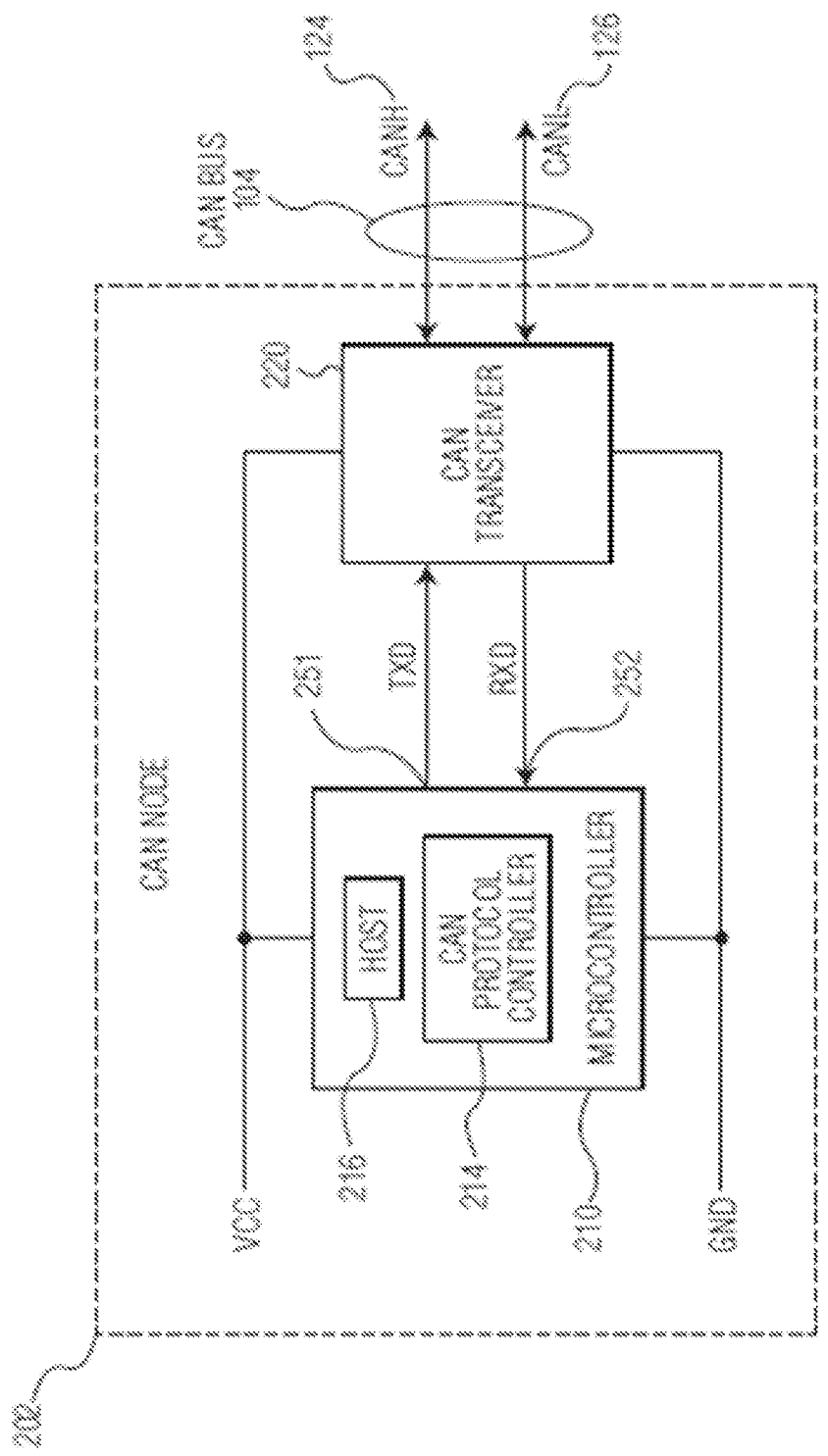
FIG. 2 schematically illustrates a simplified, overview block diagram of a CAN device, according to some examples of the present invention.

FIG. 2 illustrates a block diagram of an example of a node 202, for example one of the nodes 102-1 to 102-n of FIG. 1 in more detail. Node 202 is coupled to the CAN bus 104 with a stub line 140-1 of FIG. 1 coupled to the CANH wire 124 and a stub line 142-1 of FIG. 1 coupled to the CANL wire 126. The stub lines 140-1, 142-1 of FIG. 1 are coupled to a CAN bus transceiver 220 of the node 202. It will be appreciated, that in the case where stubs are not needed, for example for an end node, the CAN bus transceiver will be coupled directly to the wires 124 and 126. The CAN bus transceiver 220 is coupled to a CAN controller 214 via a transmit data connection (TXD) (or TXD pin) 251 and a receive data connection (RXD) (or RXD pin) 252.

The CAN controller 214 may form part of a microcontroller 210 of the node 202.

The microcontroller 210 may determine messages that are to be transmitted on the bus and provide these to the CAN controller 214. The microprocessor may receive messages from the bus from the CAN controller 214 and interpret them. The microcontroller 210 may be further connected to other entities, such as sensors or actuators and provide an interface between them and the CAN bus 104.

The CAN controller 214 may receive bits from the CAN bus 104 (via the bus transceiver 220) and reconstruct the bits into a message to be interpreted by the microcontroller 210. The CAN controller 214 may receive a message from the microcontroller 210 and provide it as serial bits to the bus via the CAN transceiver 220.

The CAN transceiver 220 may convert the digital data bits on the TXD pin 251 from the CAN controller 214 into analogue bus signals. The CAN transceiver 220 may further convert the analogue bus signals into digital bits to be provided via the RXD pin 252 to the CAN controller 214.

The implementation of the network 100, 200 may be governed by certain parameters in order to reduce ringing and protect the integrity of the signaled data at higher data rates. For example, the CAN bus 104 may have a maximum length at which maximum data rates may be achieved. In another example, the stubs 140, and 142 connecting the intermediate nodes 102-1 to 102-5 to the CAN bus 104 may be maintained as short as possible to reduce reflections. In one case, the maximum length of the CAN bus may be restricted to 40 m and the stubs to less than 0.3 m, however it will be appreciated that this is by way of example.

Despite this requirement, the length of the bus and the stubs may be subject to other factors. For example, in an automotive application for example, the implementation of the CAN bus network may be governed by the shape and size of a vehicle and position of the nodes. It may not always be possible to have stubs that are as short as desired. Furthermore, even in the case of the stubs being as short as is practical, ringing may still occur at higher data rates.

The ringing in the unterminated stub lines may corrupt the communication on the bus. This becomes more of a problem with new protocols, for example CAN FD, where the data rate is higher. One way to address ringing is to redesign network topology in order to improve termination, however this is time consuming and costly.

Some example embodiments of the present application therefore provide a method of suppressing ringing that may be readily implemented on existing network topologies. Furthermore, embodiments may take into account the speed at which this suppression is implemented and mitigate the potential of glitches occurring in ringing suppression circuits.

Basically, the maximum bus length is determined by, or rather is a trade-off with, the selected signalling rate. A signalling rate decreases as transmission distance increases. While steady-state losses may become a factor at the longest transmission distances, the major factor limiting signalling rate, as the distance is increased, is the time iations Cable bandwidth limitations, which degrade the signal transition time and introduce inter-symbol interference (ISI), are also primary factors that reduce the achievable signalling rate when transmission distance is increased. For a CAN bus, the signalling rate is also determined from (i) the total system delay (sometimes referred to as 'down and back') between the two most distant nodes of a system, and (ii) the sum of the delays into and out of the nodes on a bus with the typical e.g. 5 nsec./m propagation delay of a twisted-pair cable. Also, consideration must be given to the signal amplitude loss, due to an impedance of the cable and the input impedance of the transceivers. Under strict analysis, skin effects, proximity to other circuitry, dielectric loss, and radiation loss effects, each act to influence the primary line parameters and degrade the signal.

Since stub-lines are unterminated, signal reflections can develop in a stub that drive signal levels back and forth across a receiver's input thresholds, creating errors. Bit-sampling occurs near the end of a bit. Hence, it is mandatory that all signal reflections in a CAN stub-line be attenuated before or during the propagation delay segment, in order to provide an adequate margin of safety. To minimize reflections, stub-line length should not exceed one-third (⅓) of the line's critical length. Beyond this stub-length, many variables come into play, since the stub is no longer considered to be a lumped element/parameter. This is the maximum length that a stub remains invisible to a transmission line. The critical length of a bus line occurs at the point where the so-called 'down-and-back' propagation delay of a signal through a line equals the transition time of a signal (the greater of the rise or fall times). For instance, a typical CAN driver may have a 50 nsec. transition time, and when considering a typical twisted-pair transmission line propagation delay of 5 nsec./m, the 'down-and-back' delay for a distance of one meter becomes 10 nsec./m. The critical length becomes 5 m (50 nsec./ 10 nsec./m =5m), and the maximum un-terminated stub length for the network is ⅓ of the critical length, or 1⅔ m (≈1.67 m).

Those skilled in the art immediately understand that existing network topologies developed, say for a (lower) target data transmission rate over the network may not be maintained in case the transmission rate is increased, unless further measures are taken to suppress signal disturbances and to improve the signal quality.

Figure 3:
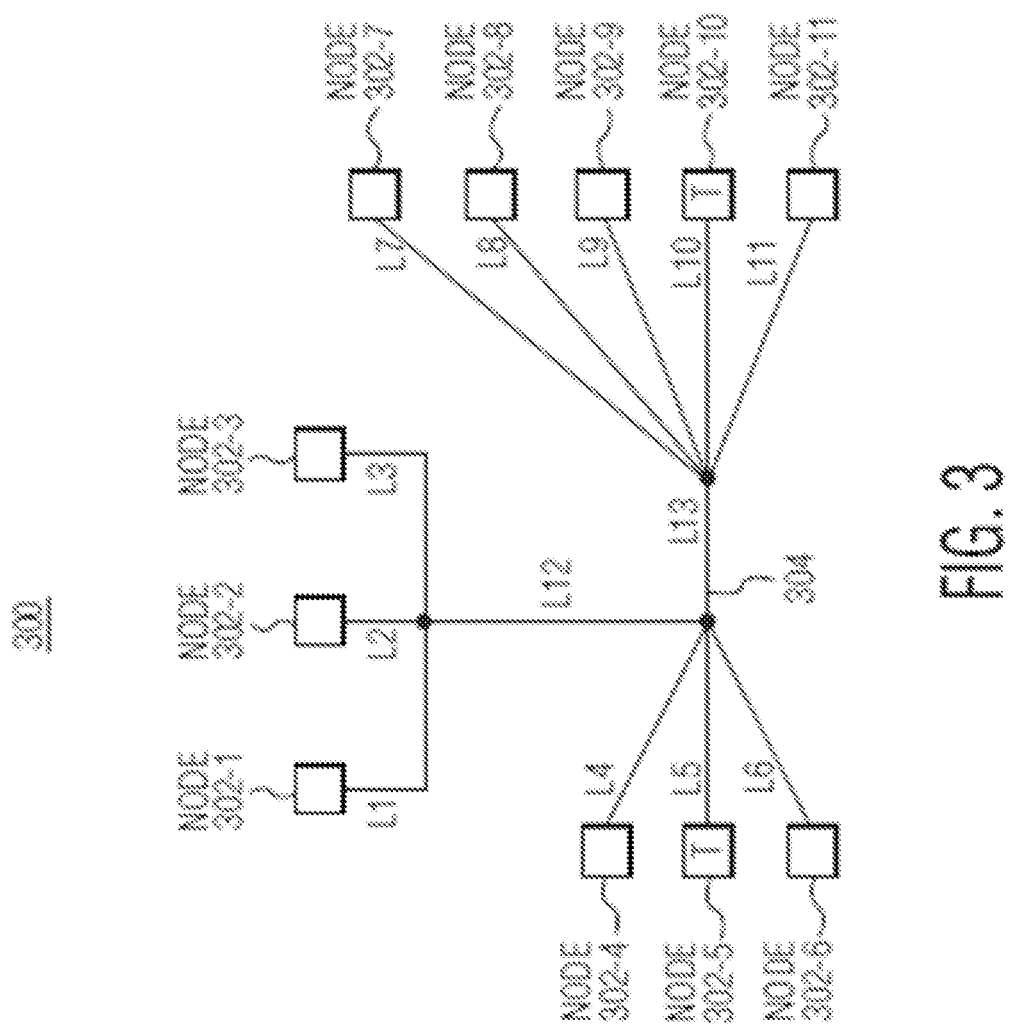
FIG. 3 schematically illustrates a block diagram of an example of a CAN bus network with multiple nodes according to some examples of the present invention.

FIG. 3 illustrates a block diagram 300 of an exemplary real case scenario of a network comprising a plurality of nodes coupled together via a CAN bus according to an example of the present application. The network comprises node '1' to node '11' 302-1 to 302-11, illustrating in general multiple nodes, coupled together for communication via the CAN bus. Herein the CAN bus and stubs thereof are shown as solid lines indicative of the aforementioned single twisted-pair cable. As illustrated, the node '5' and the node '10' should be considered to form the respective end nodes of the CAN bus. Each of the node '5' and node '10' has a termination resistance $R_{Term}$ "T" according to the nominal cable impedance, such as 120Ω.

When, for instance, one of the nodes 1, 2, 3, 4, 7, 8 or 11 that is further away from the termination resistors at the nodes '5' and '10' (exemplary stub lengths are indicated in FIG. 3) starts sending data, reflections in the network will cause signal disturbances. A CAN FD controller samples the bus for instance typically at 70% of the bit time. If the duration of the signal disturbance is longer than the typical sampling time, erroneous bit information may be captured, which results in a corrupted data message. By using longer bit time, this problem of signal disturbance may be avoided. However, this effectively limits the maximum data transmission rate of the network. Reflections due to too-long stubs are a major transmission rate limiting factor, when using network topologies develop for classical CAN protocol at a transmission rate of e.g. 500 kb/s. They are also a limiting factor for the more recent CAN FD protocol, which specifies transmission rates form 1 MBits/sec. to 5 MBits/sec. or even higher.

Further, it should be considered that even with a well-terminated network, there may be a further major transmission rate limiting factor due to a high capacitance bus loading. In the case of a high number of nodes connected to the CAN bus network, the dominant to recessive transition becomes very slow. In a recessive state the transmitter is high ohmic. When each connected node adds a capacitance of, for instance, a maximum of 100 pF to the CAN bus and the CAN bus impedance is fixed at 60Ω, the dominant to recessive transition will never be faster than approximately 100 nsec in case of a network, to which ten nodes are connected. If the network is desired to have a transmission rate of 5 MBits/sec or higher, the bit time is 200 nsec or shorter.

When any of the unterminated nodes start sending data, reflections in the network will cause signal disturbances, which depend on the physical position relative to the terminations and the cable branches. A CAN FD controller samples the bus typically close to the end of bit time and if the duration of the signal disturbance is longer, the wrong bit information might be captured. Thus, due to nodes having varying terminations, a signal disturbance can be created that causes signal degradation, which can lead to a corrupted data message. By using longer bit time, this problem of signal disturbance may be avoided, albeit at the expense of effectively limiting the maximum speed of the network.

With the newer CAN FD protocol, one of the speed limiting factors (i.e. max cable length) may be eliminated and data rates above 1 Mb/sec. are possible. However, the next limiting factor is the reflections in the network due to the stubs being too long. The reflections are a pure property of the used and available cable topology and not a consequence of the higher speed. Therefore, the topology related time period with critical reflections comes closer to the time period of a single bit, particularly at higher data rates. As a consequence, the data sample point of these shorter bits is now in danger. Automotive customers need the existing CAN network topologies for their vehicles, which allow a maximum bit-rate of 500 kb/s with classical CAN, to be able to reach bit-rates of 2 Mb/s or beyond by using CAN FD technology.

Figure 4:
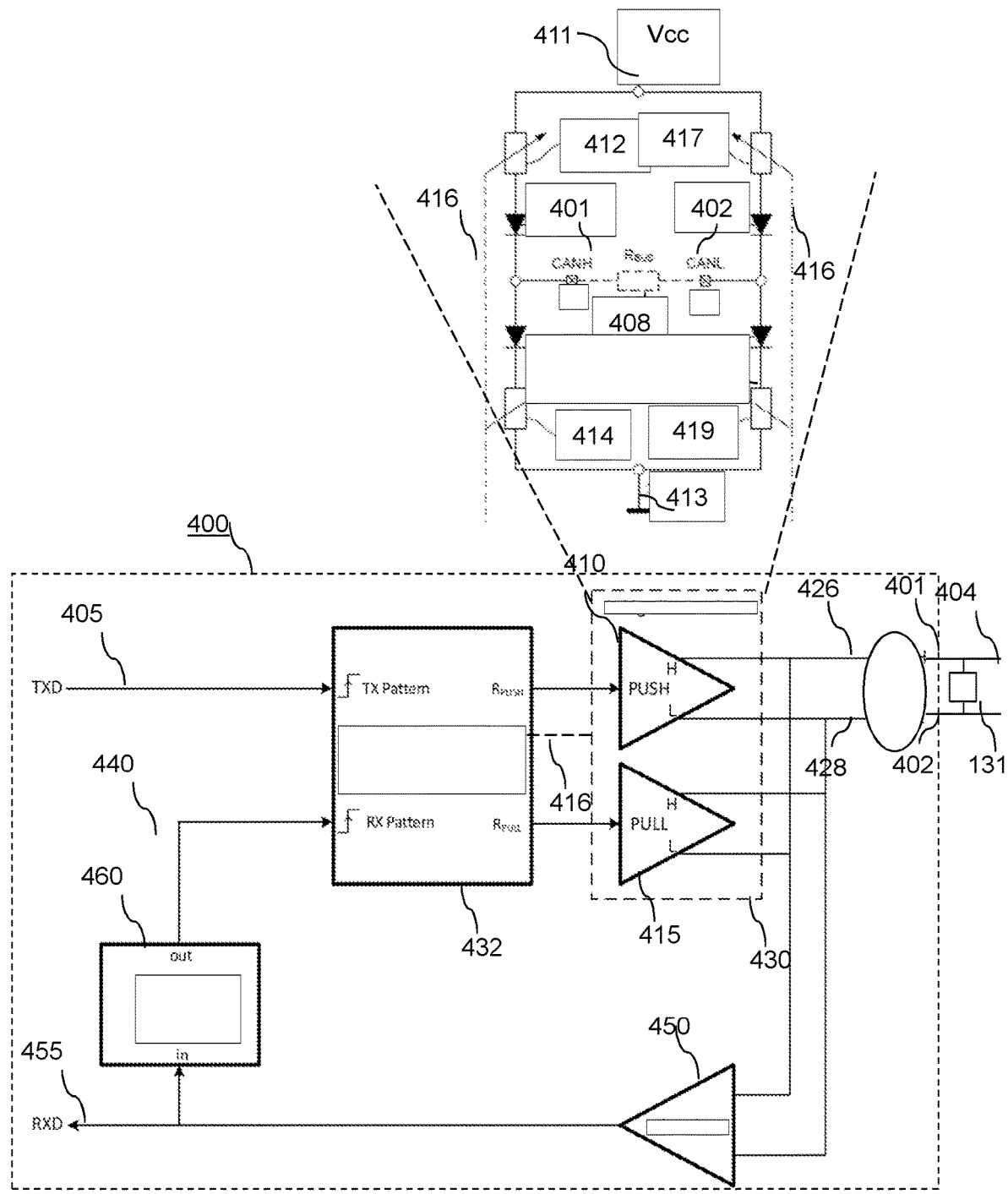
FIG. 4 illustrates a simplified block diagram of a first example of a CAN device with a feedforward combined with feedback architecture, in accordance with some examples of the invention.

Examples of the invention address the aforementioned problems by providing an architecture that combines feedforward and feedback techniques, as illustrated in FIG. 4. FIG. 4 illustrates a simplified block diagram of a first example of a CAN device 400, sometimes referred to as a CAN transceiver, for example the CAN node 202 depicted in FIG. 2. In accordance with example embodiments, the CAN device 400 includes a feedforward architecture combined with a feedback architecture 440, in accordance with examples of the invention. In the example illustrated CAN device 400 of FIG. 4, a CAN transmitter, for example in a form of an impedance bridge 430, and a controller, for example in a form of an impedance controller 432 are configured to control an output impedance of the transmitter. In other examples, it is envisaged that the feedforward architecture combined with a feedback architecture 440 of a CAN device may employ alternative transmitter and controller designs. Thus, the description hereafter that explains the operation in terms of an impedance bridge 430 and an impedance controller 432 is one such example implementation.

By controlling the impedance bridge 430 of the CAN device 400 (e.g., based on the transmit data connection (TXD) signal 405 received from the TXD path), the output impedance of the CAN device 400 can be adjusted independently of the driven differential output voltage at the CAN bus 404, i.e. the impedance bridge 430 may drive the CAN bus 404 such that the output driver impedance is independent from the output voltage. Of course, this is only valid when there is a single transmitter that is active on the CAN bus 404. Consequently, the signal reflection/ringing at the CAN bus 404 can be reduced or suppressed through the controlled impedance bridge 430.

In the embodiment depicted in FIG. 4, the impedance bridge 430 is connected to CANH and CANL terminals 401, 402, which in turn are coupled to tap/stub lines, such as tap/stub lines 140 or 142 in the example embodiment shown in FIG. 1, respectively, and further to the CANH bus wire 124 and CANL bus wire 126 (in the example embodiment shown in FIG. 1). The impedance bridge 430 includes a first leg 426, which is also referred to as CANH (side) leg, and a second leg 428, which is also referred to as CANL (side) leg. Each leg includes two controllable impedances 412, 414, e.g. adjustable resistors, with impedance properties that can be dynamically adjustable, for instance by the impedance controller 432 via control paths 416. In other examples, the controllable impedances of each leg may be, for example, adjustable capacitors, and/or adjustable inductors, etc.) In other examples, the impedance properties of each leg may be dynamically adjustable by, for instance, an edge detector. In a non-ideal implementation, it is envisaged that the impedance controller 432 may be located inside the microcontroller and/or in a CAN-FD controller. In some examples, it is also envisaged that the impedance bridge 430 and receiver may be located in a separate device (e.g. a transceiver). FIG. 4 also illustrates an expanded circuit of an example impedance bridge 430, which highlights one approach to constructing an adjustable impedance bridge.

The CANH leg of the impedance bridge 430 includes a 'push' impedance circuit 410 (e.g., implemented as at least one push resistor R$_{PUSH1}$ 412), which in some examples may be connected between a common voltage supply rail V$_{CC}$ 411 and the CANH terminal 401, and a 'pull' impedance circuit 415 (e.g., implemented as at least one pull resistor R$_{PULL1}$ 414), which is connected between the CANH terminal 401 and a common ground rail 413. The CANL leg of the impedance bridge 430 includes a pull impedance circuit (e.g., implemented as a pull resistor R$_{PULL2}$ 417), which is connected between the common voltage supply rail V$_{CC}$ 411 and the CANL terminal 402, and a push impedance circuit (e.g., implemented as a push resistor R$_{PUSH2}$), which is connected between the CANL terminal 402 and the common ground rail 413.

Although the impedance circuits 410, 415, may be implemented as resistors in some examples, it is envisaged that in other example embodiments, at least one of the impedance circuits 410, 415, may be implemented as one or more transistors (MOSFET transistors or bipolar transistors), one or more adjustable capacitors, one or more adjustable inductors, or a combination of one or more adjustable resistors, one or more capacitors, and/or one or more adjustable inductors. In some example embodiments, at least one of the push resistors, R$_{PUSH1}$ 412 and R$_{PUSH2}$ 419, and the pull resistors, R$_{PULL1}$ 414 and R$_{PULL2}$ 417, is implemented as a resistor ladder or other adjustable resistor network and the impedance controller 432 can adjust the resistance value of at least one of the push resistors, R$_{PUSH1}$ 412 and R$_{PUSH2}$ 419 and the pull resistors, R$_{PULL1}$ 414 and R$_{PULL2}$ 417 (e.g., by controlling switches (e.g., MOSFET transistors or other active semiconductor devices) within a resistor ladder or other adjustable resistor network to connect or bypass a resistor component).

In some examples, the legs may have a symmetrical resistor configuration with respect to the CANH terminal 401 and CANL terminal 402. In some examples, the CAN bus 404 may have a load impedance represented by the equivalent bus impedance, R$_{BUS}$. Typically, the bus impedance R$_{BUS}$ 408 has an impedance of approximately 60Ω in accordance with the above described typical nominal cable impedance of 120Ω provided that the CAN bus is terminated with termination resistance R$_{Term}$=120Ω at each end. In some embodiments, diodes may be connected in series with each of the impedance circuits 410, 415, in order to prevent reverse currents from flowing from the CAN bus into the common voltage supply rail 411 and into the common ground rail 413 in the case that a bus voltage that is higher than the supply voltage potential V$_{CC}$ 411 is present on the common voltage supply rail 411 or a bus voltage that is lower than a ground potential is present on the common ground rail 413. In some example embodiments, other schemes may be used to prevent reverse currents flowing from the CAN bus into the common voltage supply rail 411 and into the common ground 413, e.g., a diode in series with the common supply rail 411 and a diode in series with the common ground rail 413.

In some example embodiments, the impedance values of the adjustable push resistors R$_{PUSH1}$ 412 and R$_{PUSH2}$ 419 and the adjustable pull resistors R$_{PULL1}$ 414 and R$_{PULL2}$ 417 may be dynamically adjustable based on two parameters 'x' and 'y'. In some example embodiments, the domain of the parameter x may comprise the value range x=(0, 1), where x=(0, 1)={x∈$\mathcal{R}$, 0<x<1}, and the domain of the parameter y may comprise the value range y=(0, 2], where y=(0, 2]={y∈$\mathcal{R}$, 0<y≤2}. In some example embodiments, the parameters x and y may be independent of each other. In some example embodiments, the push impedance value Z$_{PUSH}$ of the push resistors R$_{PUSH1}$ 412 and R$_{PUSH2}$ 419 can be expressed as:

$$Z_{PUSH} = \frac{R_f}{x \cdot y} \qquad (1)$$

where Rf represents a reference resistance value. The pull impedance value Z$_{PULL}$ of the adjustable pull resistors R$_{PULL1}$ 414 and R$_{PULL2}$ 417 can be expressed as:

$$Z_{PULL} = \frac{R_f}{(1-x) \cdot y} \qquad (2)$$

The total differential impedance of the impedance bridge 430, which is also the driver impedance Z$_{CAN}$ of the CAN device 400, can be expressed as:

$$Z_{CAN} = 2 \cdot \frac{1}{\frac{1}{Z_{PUSH}} + \frac{1}{Z_{PULL}}} \qquad (3)$$

$$Z_{CAN} = 2 \cdot \frac{R_f}{y} \qquad (4)$$

The total differential impedance of the impedance bridge 430, which is the driver impedance, Z$_{CAN}$, of the CAN device 400, can be dynamically adjusted to any impedance value between a low ohmic state, which is herein determined by a lowest driver impedance value Z$_{CAN}$=R$_f$, and a high ohmic state, which is herein represented by Z$_{CAN}$=∞. R$_f$ is the minimum drive impedance value of the CAN device 400. For instance, the minimum drive impedance value may be R$_f$=15Ω. It should be noted that a high ohmic state, referred herein by Z$_{CAN}$=∞, may comprise a maximum drive impedance value in a range of kilo Ohms or mega Ohms. The driver impedance, Z$_{CAN}$, needs to be high ohmic compared to the equivalent bus impedance, R$_{BUS}$, 408 in order to allow the differential bus impedance to reach the nominal value of, e.g., 60 Ohms again at the end of a slow bit time. Consequently, the ratio between the maximum drive impedance and the minimum drive impedance may in a range of, e.g., thousand or more.

In some example embodiments, the impedance controller 432 may be implemented as a processor, such as a microcontroller. In some example embodiments, the impedance controller includes a signal edge detector. In some example embodiments, the impedance controller 432 may be configured to detect a transition of the CAN device 400 from a dominant state to a recessive state. In response to detecting a transition of the CAN device 400 from the dominant state to the recessive state, the impedance controller 432 may control an output impedance of the impedance bridge 430 (e.g., the impedance measured between the CANH and CANL terminals 401, 402) to be within a certain percentage above or below the impedance value at the dominant state (e.g., by simultaneously adjusting the impedance configuration of the push resistors, R$_{PUSH1}$ 412 and R$_{PUSH2}$ 419, and the pull resistors, R$_{PULL1}$ 414 and R$_{PULL2}$ 417, in this example circuit, such that the output impedance of the impedance bridge to be within a certain percentage above or below the impedance value at the dominant state while the differential output voltage decreases to a predefined voltage). Substantially concurrently, the differential driver voltage on the CAN bus 404 (e.g., the different voltage measured between the CANH and CANL terminals 401, 402) may be connected to the CAN device 400 and decreases to a predefined voltage (e.g., 0V or other suitable voltage level). For example, the output impedance of the CAN device 400 may be controlled to be ±5%, ±10% or within other suitable value range of the impedance value at the dominant state while the differential driver voltage on the CAN bus decreases to the predefined voltage. In some embodiments, the output impedance of the CAN device 400 is controlled to be at a fixed impedance while the differential output voltage decreases to a predefined voltage.

By controlling the output impedance of the CAN device 400 to be within a certain percentage above or below the impedance value at the dominant state during the ramping down of the differential driver voltage, the energy dissipated into the CAN network can be reduced, thereby resulting in lower reflections on the CAN bus 404, under various CAN bus topologies and data speeds.

In some examples, the impedance controller 432 may detect the transition of the CAN device 400 from the dominant state to the recessive state by monitoring the transmit data connection (TXD) signal 405 received from the TXD path at the CAN device 400 (e.g., from the microcontroller 210 of FIG. 2). For example, the impedance controller may detect the transition of the CAN device 400 from the dominant state to the recessive state by identifying a signal edge of the TXD signal 405. An active CAN device 400 (i.e., a CAN device 400 in the dominant state) drives the CAN bus waveform to a "dominant" state, represented as a logic low level (logic zero) of the TXD signal 405. An inactive CAN device 400 (i.e., a CAN device 400 in the recessive state) removes its differential output voltage from the CAN bus, represented as a logic high level (logic one) of the TXD signal 405. Although specific logic levels of the TXD signal are described, in other networks it is envisaged that other signal logic levels may be used. In some embodiments, the impedance controller 432 may be configured to control the resistance values of the adjustable push resistors, $R_{PUSH1}$ 412 and $R_{PUSH2}$ 419 and the adjustable pull resistors, $R_{PULL1}$ 414 and $R_{PULL2}$ 417 of the impedance bridge 430 while the differential driver voltage on the CAN bus connected to the CAN device 400 decreases to the predefined voltage.

In an example embodiment, during a positive/rising or negative/falling signal edge of the TXD signal 405, the impedance controller 432 may adjust the resistance values of one or more of the adjustable push resistors, $R_{PUSH1}$ 412 and $R_{PUSH2}$ 419 and the adjustable pull resistors, $R_{PULL1}$ 414 and $R_{PULL2}$ 417. For example, during a dominant (falling) edge of the TXD signal 405, the impedance controller 432 may adjust the resistance values of the adjustable push resistors, $R_{PUSH1}$ 412 and $R_{PUSH2}$ 419 while keep the resistance values of the adjustable pull resistors, $R_{PULL1}$ 414 and $R_{PULL2}$ 417 static high ohmic to be within a certain percentage above or below the impedance value at the dominant state. In another example, during a recessive (rising) edge of the TXD signal 405, the impedance controller 432 may adjust the resistance value of each of the adjustable push resistors, $R_{PUSH1}$ 412 and $R_{PUSH2}$ 419, and the adjustable pull resistors, $R_{PULL1}$ 414 and $R_{PULL2}$ 417, individually with different slopes in order to keep the overall impedance of the impedance bridge 430 to be within a certain percentage above or below the impedance value at the dominant state.

In some embodiments, the impedance controller 432 is configured to increase the output impedance of the CAN device 400 (e.g., the impedance measured between the CANH and CANL terminals 401, 402) while the differential driver voltage on the CAN bus 404 (e.g., the different voltage measured between the CANH and CANL terminals 401, 402) is maintained at the predefined voltage. Because the CAN bus voltage is maintained at the predefined voltage (e.g., 0V) while the output impedance of the CAN device 400 is increased, the impedance change will not result in large amount of energy dissipating into the CAN network and thus reduce or prevent a new reflection on the CAN bus. For example, at least one of the push resistors, $R_{PUSH1}$ 412 and $R_{PUSH2}$ 419 and the pull resistors, $R_{PULL1}$ 414 and $R_{PULL2}$ 417, may be implemented as a resistor ladder or other adjustable resistor network and the impedance controller can increase the resistance value of at least one of the push resistors, $R_{PUSH1}$ 412 and $R_{PUSH2}$ 419, and the pull resistors, $R_{PULL1}$ 414 and $R_{PULL2}$ 417 (e.g., by controlling switches within a resistor ladder or other adjustable resistor network to connect a resistor component). The impedance controller 432 may increase the output impedance of the CAN device 400 to be within a threshold of a range of a characteristic impedance of the CAN bus, for example ±10% characteristic impedance of the CAN bus and preferably substantially equal to a characteristic impedance of the CAN bus, or to a predefined impedance value that is lower or higher than the characteristic impedance of the CAN bus before a data sample point to avoid data sample error (e.g., ±5%, ±10% or within other suitable value range of the characteristic impedance of the CAN bus) while the differential driver voltage on the CAN bus is maintained at the predefined voltage. In some embodiments, the impedance controller 432 increases the output impedance of the CAN device 400 to be substantially equal to a characteristic impedance of the CAN bus (e.g., ±5%, ±10% or within other suitable value range), whilst the differential driver voltage on the CAN bus is maintained at the predefined voltage and subsequently, increases the output impedance of the CAN device 400 from the characteristic impedance of the CAN bus to a high ohmic value while the differential driver voltage on the CAN bus is maintained at the predefined voltage.

The inventors of the present invention have recognised and appreciated that the feedforward architecture of employing an impedance controller 432 with an impedance bridge 430 exhibits the fastest response time on the dominant to recessive transition of the CAN bus, and is able to support the highest CAN FD baud-rates and error frame detection. Using the 'push' impedance circuit 410 and the 'pull' impedance circuit 415, only one ringing suppression device is active during the data-phase transmission. Due to this behaviour there is a potential performance penalty with network topologies that are badly designed, for example where cable wire length sections may not be equal and cause colliding reflections. Thus, a single transmitter is not able to drive the CAN bus 404 low ohmic enough to counteract these colliding signal reflections effectively over all the topology.

Therefore, in accordance with examples of the invention, the CAN device 400 is modified to include an additional feedback (receiver) path. In some examples, it is envisaged that the additional feedback (receiver) path can be the existing CAN bus receiver circuit 450 or a dedicated receiver.

In this example, the receiver circuit 450 is connected to a filter circuit 460, such that the receiver circuit receives a differential signal on the CAN bus 404 and outputs a receiver data (RXD) signal 455. The receiver detects a falling voltage on the CAN bus, i.e. falling below a trigger voltage level (e.g. falling to a level between 0.9V and 0.5V), with a condition that the CAN bus voltage was high enough for a certain previous time, e.g. 400 ns @2 Mbps, thereby avoiding a detection of CAN bus glitches. The determination that the CAN bus voltage was high enough for a certain previous time is achieved, in this example, using filter circuit 460.

A preferred implementation is to use the existing receiver circuit, as illustrated in FIG. 4, because to prevent false triggering the receiver circuit 450 is already designed with the best signal to noise ratio and voltage thresholds in mind.

For CAN devices 400 supporting high baud rates the receiver circuit 450 is already as fast as possible. Hence, this is the best kind of circuit to be used for the feedback ringing suppression. The current ISO11898-2:2016 CAN standard only requires a receiver voltage threshold is between 0.9V and 0.5V. An improvement which is already used in the state-of-art CAN devices 400 is hysteresis, in which the falling voltage threshold is between 0.7V and 0.5V and the rising voltage threshold is between 0.9V and 0.7V. This hysteresis improves the signal to noise ratio because a reflection on the CAN bus will only be detected when the bus voltage rises above 0.7V instead of above a worst-case voltage of 0.5V in case of a receiver without hysteresis, thereby providing a 200 mV noise margin improvement.

In some examples, in order to reduce or to prevent false triggering of the feedforward ringing suppression circuit, the trigger voltage should be set as low as possible, but still high enough to be able to reliably detect a dominant to recessive edge.

Figure 5:
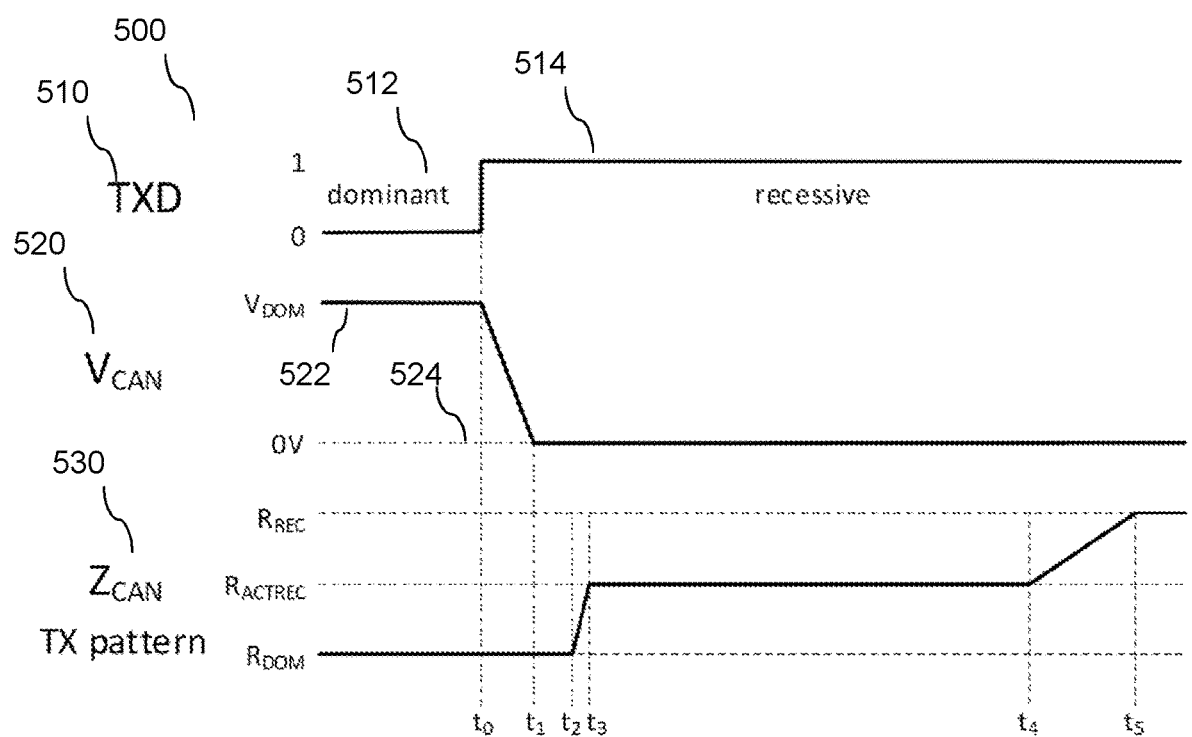
FIG. 5 illustrates an example of an idealized transmitting node dominant to recessive operation.
Figure 6:
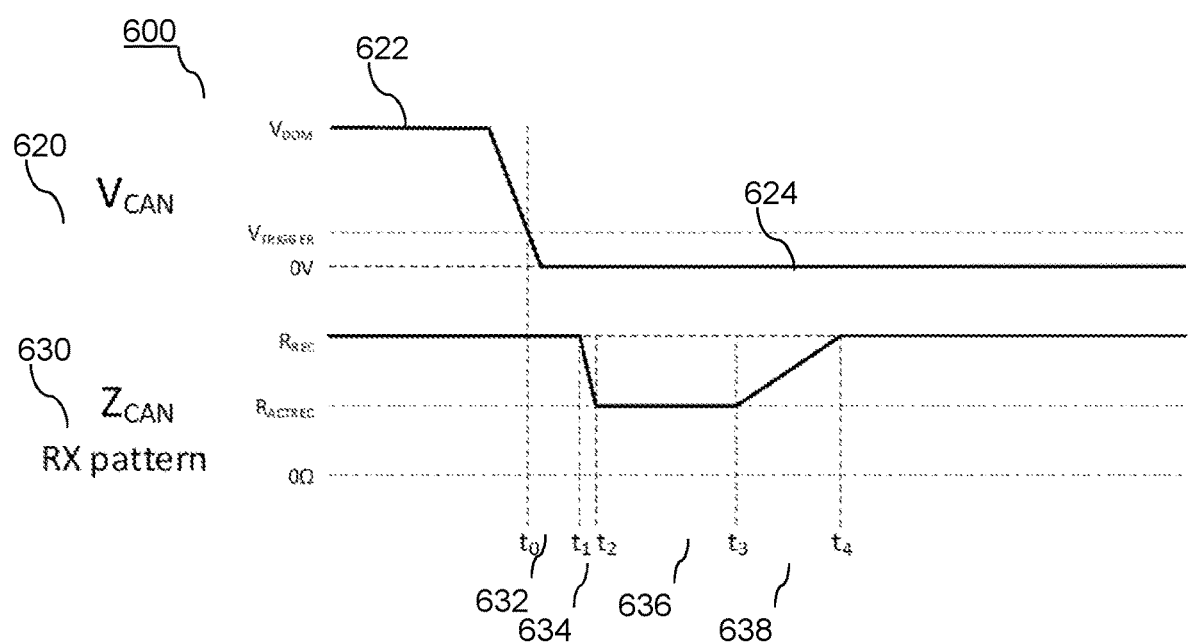
FIG. 6 illustrates an example of a detection of a CAN device operating as a receiving node in a dominant to recessive operation, in accordance with some examples of the invention.

In examples of the invention, the impedance controller 432 together with the impedance bridge 430 may be configured to drive the CAN bus 404 with a certain voltage and impedance wave shape (as illustrated in the third waveform of FIG. 5). Depending upon whether the CAN device 400 is active as a transmitting node or as a receiving node dictates how the CAN bus voltage and impedance are driven. For example, when the CAN device 400 is active as a transmitting node, a dominant to recessive edge on TXD input pin is detected (e.g. in a feedforward implementation), and the TXD line is toggling as illustrated in FIG. 5. If a '0' is detected on the TXD line, then the CAN device is not allowed to act on the receiver pattern node. If a '0' to '1' transition is detected on the TXD line, then the CAN device 400 is not allowed to act on the receiver pattern node for a certain period of time. This blanking time is equal to the length of the transmitting node pattern, depicted in FIG. 5 by time t5 minus time t0. If a '1', is detected on the TXD line, then the impedance controller 432 of the CAN device 400 is able to execute the receiver node impedance in bridge impedance 430. In contrast, when the CAN device 400 is active as a receiving node, a dominant to recessive edge on a CAN bus pin may be detected (e.g. in a feedback implementation), as illustrated in FIG. 6.

Although the example in FIG. 4 illustrates a push-pull stage being located on a CAN transmitter, it is envisaged that in other examples, a floating switch that exhibits an 120 ohm impedance may be used.

In this manner, the bridge impedance 430 may be controlled differently by the impedance controller 432 dependent upon whether the CAN device is detected as operating as either a transmitter node or a receiver node. Advantageously, such an approach can be adopted in known CAN systems or CAN FD systems, without any change to a CAN controller, noting that a known CAN controller could also be made non-standardized by employing an additional pin between the controller and the CAN device 400 next to the TXD/RXD pins, as an alternative approach to implementing some of the example concepts herein described.

Referring now to FIG. 5, a timing diagram example 500 illustrates an idealized transmitting node dominant to recessive operation, in accordance with examples of the invention. A first waveform is representative of, for instance, a transmit data (TXD) signal 510 of an idealized CAN bus signal resulting from a CAN transmitter operating between a power supply rail 411 of $V_{CC}$, for example equal to 5 volts and ground. An active CAN device, such as CAN device 400 of FIG. 4, drives the waveform to a "dominant" state 512 representing a logic low level (logic zero). Bus transceivers are biased at approximately $V_{CC}/2$ such that the differential waveform peaks CANH 111 and CANL 112 avoid distortion by not approaching the supply voltage rails. A CAN bus logic high, "recessive" level 514, results when transceiver drivers are inactivated and remove their respective differential output voltages from the CAN bus, i.e. transitioning from a CAN dominant voltage 522 to, say, a zero voltage 524.

At time point, $t_0$, the TXD signal 510 on the TXD transitions from low to high, which causes a dominant 512 to recessive 514 transition of the differential driver voltage $V_{CAN}$ on the CAN bus, such as CAN bus 404 in FIG. 4 (e.g., the differential voltage measured between the CANH and CANL terminals 401, 402). It will be appreciated that the low to high transition of TXD signal 510 on the TXD path may not immediately cause a change on the CAN bus voltage $V_{CAN}$ 520, for example because there may be a delay as the TXD signal 510 on the TXD path is received by the CAN device 400 and converted to a voltage level for the CAN bus. In the dominant state 512, the impedance controller 432 of FIG. 4 controls the push resistors, $R_{PUSH1}$ 412 and $R_{PUSH2}$ 419, to stay at a dominant impedance level (e.g., 15Ω) and the pull resistors, $R_{PULL1}$ 414 and $R_{PULL2}$ 417, to stay high ohmic, which results in a low ohmic driver impedance, $Z_{CAN}$, 530 that is at the dominant impedance level, $R_{DOM}$ (e.g., 30Ω).

In response to the detection of the dominant to recessive transition at time point, to, the impedance controller 432 controls the push resistors, $R_{PUSH1}$ 412 and $R_{PUSH2}$ 419, and the pull resistors, $R_{PULL1}$ 414 and $R_{PULL2}$ 417, to control the driver impedance, $Z_{CAN}$, such that it is unchanged. For example, between time point, $t_0$, and time point, $t_1$, the resistance value of each of the push resistors, $R_{PUSH1}$ 412 and $R_{PUSH2}$ 419, and the pull resistors, $R_{PULL1}$ 414 and $R_{PULL2}$ 417, is changed that the CAN bus voltage, $V_{CAN}$, ramps from $V_{DOM}$ to zero while the driver impedance, $Z_{CAN}$, 530 stays constant. The impedance controller may gradually increase the resistance values of the push resistors, $R_{PUSH1}$ 412 and $R_{PUSH2}$ 419, from one value (e.g., 15 Ohms) to a higher value (e.g., 30 Ohms) while decrease the resistance values of the pull resistors, $R_{PULL1}$ 414 and $R_{PULL2}$ 417, from "infinite" to a certain value (e.g., 30 Ohms). At the time point, $t_1$, the resistance values of the push resistors, $R_{PUSH1}$ 412 and $R_{PUSH2}$ 419, and the pull resistors, $R_{PULL1}$ 414 and $R_{PULL2}$ 417, may be identifiable to each other, while the driver impedance, $Z_{CAN}$, stays constant. At time point, $t_1$, the CAN bus voltage, $V_{CAN}$, 520 reaches the recessive state (0V) and the impedance controller controls the driver impedance, $Z_{CAN}$, 530 unchanged from the impedance value of the driver impedance, $Z_{CAN}$, 530 at time point, to. After the CAN bus voltage, $V_{CAN}$, 520 reaches the recessive state (0V), the impedance controller controls the driver impedance, $Z_{CAN}$, unchanged for another time duration. By controlling the driver impedance, $Z_{CAN}$, 530 unchanged during the ramping down of the CAN bus voltage, $V_{CAN}$, 520 the energy dissipated into the CAN network can be reduced, resulting in lower reflection on the CAN bus 404.

At time point, $t_2$, the impedance controller 432 of FIG. 4 begins to increase the driver impedance, $Z_{CAN}$, 530 from the low ohmic impedance of $R_{DOM}$, to a higher value until time point, $t_3$. For example, at least one of the push resistors, $R_{PUSH1}$ 412 and $R_{PUSH2}$ 419, and the pull resistors, $R_{PULL1}$ 414 and $R_{PULL2}$ 417 may be implemented as a resistor ladder or other adjustable resistor network and the impedance controller can increase the resistance value of at least one of the push resistors, $R_{PUSH1}$ 412 and $R_{PUSH2}$ 419, and the pull resistors, $R_{PULL1}$ 414 and $R_{PULL2}$ 417, (e.g., by controlling switches within a resistor ladder or other adjustable resistor network to connect a resistor component). At time point, $t_3$, the driver impedance, $Z_{CAN}$, 530 reaches the active recessive impedance level, $R_{ACTREC}$, which may be adapted to the characteristic impedance of the CAN network cable (e.g. 120 ohm) or any other suitable value. Because the CAN bus voltage, $V_{CAN}$, 520 is maintained at 0V while the driver impedance, $Z_{CAN}$, 530 is increased, the impedance change will not result in large amount of energy dissipating into the CAN network and thus reduce or prevent a new reflection on the CAN bus 404. The adjustment of the driver impedance, $Z_{CAN}$, 530 may be performed continuously over time and may be increased at a constant change rate. In some example embodiments, the constant change rate of the driver impedance, $Z_{CAN}$, 530 is set to be lower than a predefined value, in order to gradually increase the driver impedance, $Z_{CAN}$ 530. The impedance controller can adjust the driver impedance, $Z_{CAN}$, 530 by controlling the push resistors, $R_{PUSH1}$ 412 and $R_{PUSH2}$ 419, and the pull resistors, $R_{PULL1}$ and $R_{PULL2}$ 413, to increase their impedances from a starting push impedance (e.g., $Z_{CAN}$=30Ω) to a target push impedance (e.g., $Z_{CAN}$=120Ω). In some embodiments, the impedance controller increases the impedances of the push resistors, $R_{PUSH1}$ 412 and $R_{PUSH2}$ 419, and the pull resistors, $R_{PULL1}$ and $R_{PULL2}$ 413, continuously over time at a constant change rate. In some embodiments, the time duration between time point, $t_1$, and time point, $t_2$, is zero.

The reflection on the CAN bus 404 is suppressed up to time point, $t_4$. The longer the time duration between time point, $t_0$, and time point, $t_4$ is, the better the ringing suppression performance will be. At time point, $t_4$, the impedance controller 432 begins to increase the driver impedance, $Z_{CAN}$, 530 from the active recessive impedance level, $R_{ACTREC}$, to a higher value until time point, $t_5$. At time point, $t_5$, the driver impedance, $Z_{CAN}$, reaches the recessive impedance level, $R_{REC}$. In some embodiments, the time during between time point, $t_4$, and time point, $t_5$, is above a certain time duration to reduce or prevent additional energy from dissipating into the CAN network in case the bus voltage is not zero at time point, $t_4$. For example, the bus voltage may not be zero at time point, $t_4$, if another transmitter is also driving the bus dominant, e.g., during arbitration or when an error frame is transmitted. The threshold time duration between $t_4$ and $t_5$ depends on the network topology complexity.

Referring now to FIG. 6, a timing diagram example 600 illustrates an example of a detection (in a receiver/feedback circuit) of a CAN device operating as a receiving node in a dominant to recessive operation on a CAN bus pin, in accordance with some examples of the invention.

A first waveform 620 illustrates when CAN device drivers are inactivated and their respective differential output voltages removed from the CAN bus, i.e. transitioning from a CAN dominant voltage 622 to, say, a zero voltage 624. Here, a receiver circuit detects a falling voltage on the CAN bus, i.e. falling below a trigger voltage level (e.g. falling to a level between 0.9V and 0.5V), with a condition that the CAN bus voltage was high enough for a certain previous time. The determination that the condition that the CAN bus voltage was high enough for a certain previous time may be achieved using, say, a filter circuit, such as filter circuit 460 of FIG. 4, to perform bus filtering, e.g. 400 nsec@2 Mbps. A determination is also made that the TXD input is recessive for at least a time that is longer than a blanking time, (thereby indicating that the CAN device is operating as a receiving node). The impedance controller, such as impedance controller 432 in FIG. 4, then generates an impedance curve such as the second waveform 630 depicted in FIG. 6.

If, for example, the push and pull output stages, for example push and pull output stages 410, 415 of bridge impedance 430 of FIG. 4, are driven equally, this results in the CAN bus being driven to 0V with a certain impedance. A first time delay 632 between times $t_0$ and $t_1$ indicates a combination of filter processing time and receiver delay, where a typical practical value may be between 10 nsec and 50 nsec. A second time delay 634 between time $t_1$ to $t_2$ indicates a transition time from high impedance to low impedance (a so-called active recessive impedance), where a typical practical value may be 10 nsec. A third time delay 636 between times $t_2$ to $t_3$ indicates a so-called active recessive time, which is the time period in which output impedance is substantially equal to the cable impedance preventing reflections. A fourth time delay 638 between times $t_3$ to $t_0$ indicates a so-called slow release, and prevents new reflections when the bus voltage was not zero volts due to other dominant transmitters. A typical practical time period of this fourth time delay 638 is 75 nsec. In essence, the total time between $t_0$ and t4 (i.e., 632+634+636+638) depends on the CAN bus baud rate, because if this time becomes longer compared to the sample point of the CAN-FD controller, the communication will be corrupted since all nodes are driving the bus at low ohmic, such that a node transmitting dominant (i.e. in an error frame condition) will be over written with recessive signal. In this case, the worst-case sample point at a 2 Mbps is ~220 nsec, whereas at 5 Mbps the worst-case sample point is 65 nsec. At 2 Mbps a practical time between $t_2$ and $t_3$ is 85 nsec (=220 nsec−50 nsec−10 nsec−75 nsec). Due to the delay of a typical reliable receiver, the reaction time of a feedback ringing suppression may be so slow that there is no suppression time left at 5 Mbps.

Thus, there is still a risk that the receiver circuit (such as receiver circuit 450 of FIG. 4) will be triggered not on the dominant to recessive edge, but on a glitch that is present on the CAN bus. Such glitches may be caused by electromagnetic coupling (EMC) interference or the CAN bus wire coupling to other high switching current carrying wires. In a normal CAN system these glitches on the RXD pin of the CAN device do not result in a communication problem because the recessive state is only assessed at the sample point. Such glitches on the CAN bus can be extended in time due to feedback ringing suppression concept thereby increasing the chance that the glitch is extended into the sample point window.

Figure 7:
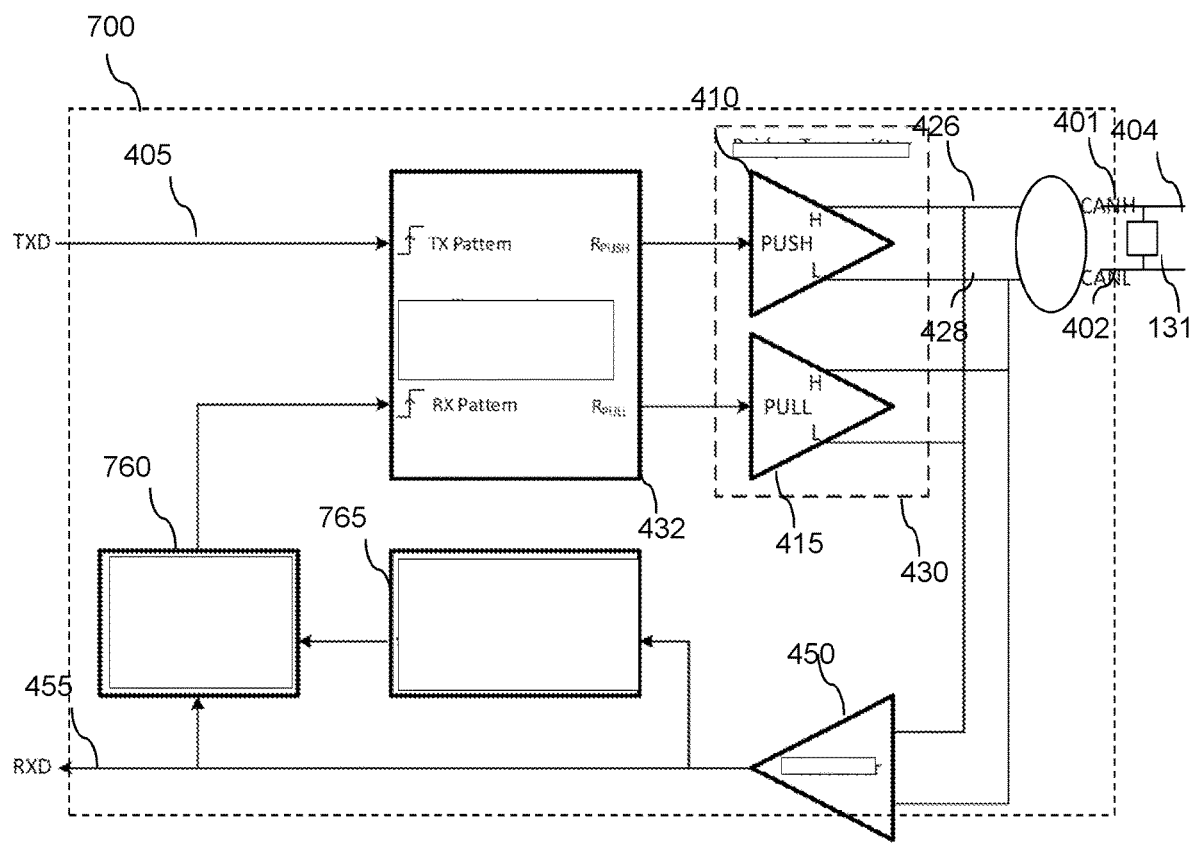
FIG. 7 illustrates a feedback concept with window filtering, in accordance with some examples of the invention.

In some example embodiments, in order to avoid glitches on the CAN bus that are extended in time due to feedback ringing suppression concept, thereby increasing the chance that the glitch is extended into the sample point window, a windowing concept may be employed. One example of a circuit architecture that may be used to employ the windowing concept is illustrated in FIG. 7, in accordance with examples of the invention. The windowing concept in FIG. 7 replaces the filter circuit 460 in FIG. 4 in an attempt to remove glitches when a transmitter node is driving dominant on the Can bus, and when another node is recessive, i.e. when a dominant signal may be disturbed due to an additional 120 ohm impedance being introduced.

The transmitter operation of FIG. 4 is the same as FIG. 7, so a description of the operation will not be repeated here for simplicity purposes only. In FIG. 7, the output RXD signal of the receiver circuit 450 is connected to a bit time logic (BTL) circuit 765, that is configured to synchronize the RXD signal 455 to the CAN bus data stream, in a similar manner to the operation of a known CAN-FD controller. In this manner, the BTL circuit 765 is able to predict a potential dominant to recessive transition on the CAN bus 404.

The synchronized output from BTL circuit 765 is input into a window filter 760, which is configured to reject the output of the receiver outside a potential dominant to recessive transition. The BTL circuit 765 is configured to permanently synchronize the RXD signal in a similar manner to a CAN protocol controller. As long as there are disturbances on the CAN bus lines of a magnitude, that still allow proper operation of a CAN protocol controller, the BTL circuit 765 inside the CAN device 700 is able to recognize the potential edges on the bus with a same performance. With such an embedded BTL circuit 765 inside the CAN device 700, the CAN device 700 is now able to reliably predict where a potential CAN protocol relevant bit transition can happen in time. In some examples, the BTL circuit 765 may be able to limit that prediction to dominant-to-recessive bit transitions. In this manner, in some examples, the BTL circuit 765 may be configured to solve a ringing suppression specific problem, rather than purely decode the CAN bit stream as described in other known CAN systems.

Figure 8:
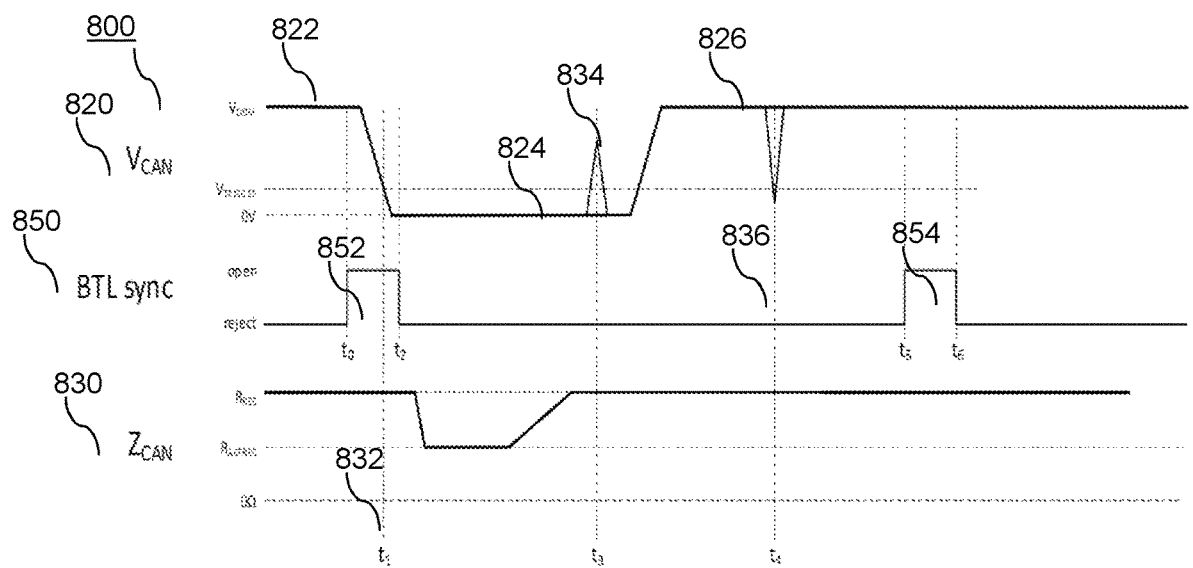
FIG. 8 illustrates a timing diagram of the example feedback concept with window filtering of FIG. 7, in accordance with some examples of the invention.

Referring now to FIG. 8, a timing diagram of the example feedback concept with window filtering of FIG. 7 is illustrated in accordance with examples of the invention. A first waveform 820 illustrates when CAN device drivers are inactivated and their respective differential output voltages removed from the CAN bus, i.e. transitioning from a CAN dominant voltage 822 to, say, a zero voltage 824. Here, a receiver circuit detects a falling voltage on the CAN bus, i.e. falling below a trigger voltage level (e.g. falling to a level between 0.7V and 0.5V), with a condition that the CAN bus voltage was high enough for a certain previous time.

A second waveform illustrates the timing of a BTL synchronisation input signal 850, such as the output signal from BTL circuit 765 of FIG. 7. The time period 852 between times t0 and t2 indicates the BTL being synchronized to the data-stream on the CAN bus, and opens the window for triggering on a dominant-recessive edge. A third waveform 830 indicates the impedance waveform generated by the impedance controller, such as impedance controller 432 of FIG. 4. At time $t_1$ 832, a dominant to recessive edge is detected in the first waveform 820 and the impedance controller 432 generates an impedance curve 830 described in $Z_{CAN}$. At time t3 834, a dominant glitch during the recessive state 824 is present on the CAN bus, and without window filtering the impedance controller 432 may be triggered to generate an impedance curve 830 that potentially disturbs the following recessive to dominant edge. In this example, with window filtering active, as described in FIG. 7, the glitch at time $t_3$ 834 is rejected. At time $t_0$ 836, a recessive glitch during the dominant state 826 is present on the CAN bus and without window filtering the impedance controller 432 may be triggered to generate an impedance curve disturbing the dominant state. However, with window filtering active as described in FIG. 7, this glitch at time t4 836 is rejected. In the second waveform, between times $t_5$ to $t_6$ 854, the trigger window is open for a potential recessive edge, but no dominant to recessive edge is detected.

In this window filtered feedback concept, the BTL circuit 765 of FIG. 7 needs to know initially what the CAN-FD baud-rate is. Therefore, in some examples, this can be either fixed in a CAN device or configured by a certain interface (not shown), such as a serial-to-parallel interface, SPI. In other examples, other interfaces may be employed between a microcontroller and a CAN device, such as an I2C interface. In some examples, this requirement to initially know what the CAN-FD baud-rate may be addressed by adding a baud-rate detector circuit, as shown in FIG. 9.

Figure 9:
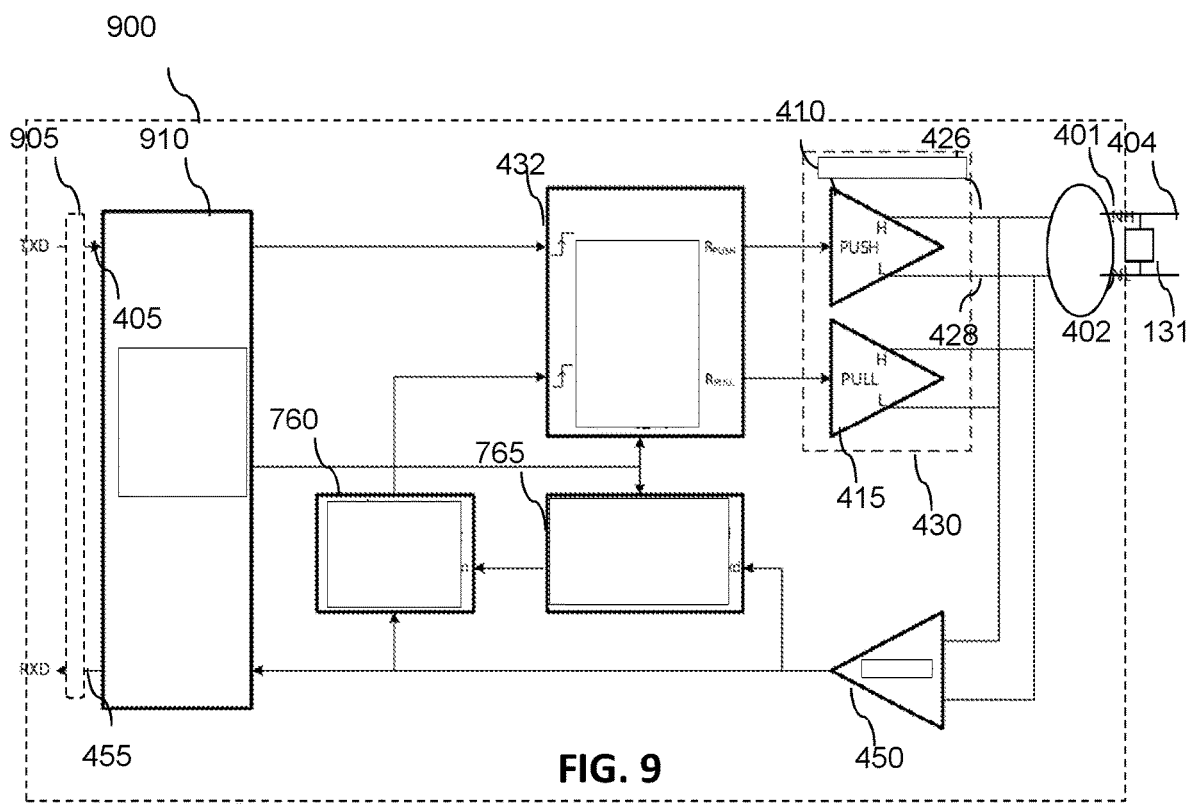
FIG. 9 illustrates a baud-rate detector block diagram, in accordance with some examples of the invention.

Referring now to FIG. 9, a CAN device 900 with a baud-rate detector 910 is illustrated, in accordance with some examples of the invention. Again, in some example embodiments, in order to avoid glitches on the CAN bus that are extended in time due to feedback ringing suppression concept, thereby increasing the chance that the glitch is extended into the sample point window, a windowing concept may be employed. One example of a circuit architecture that may be used to employ the windowing concept is illustrated in FIG. 9, in accordance with examples of the invention. The windowing concept in FIG. 9 replaces the filter circuit 460 in FIG. 4 in an attempt to remove glitches when a transmitter node is driving dominant on the Can bus, and when another node is recessive, i.e. when a dominant signal may be disturbed due to an additional 120 ohm impedance being introduced.

The transmitter operation of FIG. 4 is the same as FIG. 9, so will not be repeated for simplicity purposes only. In FIG. 9, the output RXD signal of the receiver circuit 450 is again connected to a bit time logic (BTL) circuit 765, that is configured to synchronize the RXD signal 455 to the CAN bus data stream, in a similar manner to the operation of a known CAN-FD controller. In this manner, the BTL circuit 765 is able to predict a potential dominant to recessive transition on the CAN bus 404.

The synchronized output from BTL circuit 765 is input into a window filter 760, which is configured to reject the output of the receiver outside a potential dominant to recessive transition. The BTL circuit 765 is configured to permanently synchronize the RXD signal in a similar manner to a CAN protocol controller. As long as there are disturbances on the CAN bus lines of a magnitude that still allows proper operation of a CAN protocol controller, the BTL circuit 765 inside the CAN device 700 is able to recognize the potential edges on the bus with a same performance. With such an embedded BTL circuit 765 inside the CAN device 900, the CAN device 900 is now able to reliably predict where a potential CAN protocol relevant bit transition can happen in time. In some examples, the BTL circuit 765 may be able to limit that prediction to dominant-to-recessive bit transitions. In this manner, in some examples, the BTL circuit 765 may be configured to solve a ringing suppression specific problem, rather than purely decode the CAN bit stream, as described in other known CAN systems.

When the CAN device 900 is powered up for the first time the baud-rate detector 910 is configured to block the TXD signal 405 to the impedance controller 432 and block the RXD signal 455 to the CAN-FD controller. The microcontroller will need to transmit a CAN-FD frame after power-on, which contains, e.g., a 1010 1010 pattern in the data-phase, such that the baud-rate detector 910 is able to derive the baud-rate from that CAN FD frame.

In some examples, it is envisaged that the architecture of the CAN device 900 may be able to support different frame lengths and types, so long as it employs a "known" data pattern. During this learning phase the RXD (output) signal 455 follows the TXD (input) signal 405, such that the CAN-FD controller does not detect an error. Optionally the baud rate detector 910 may provide the CAN Acknowledge bit upon proper detection of the baud rate.

In some examples, only a software change is required in the microcontroller in order to transmit a dummy/learning message after power-on. After the learning phase, the baud-rate detector 910 configures the BTL circuit 765 and the transmitter/impedance controller to operate with the right timing, and lets the TXD signal 405 and RXD signal 455 pass. Depending upon the learned baud-rate the transmitter/impedance controller may be configured such that a length of active recessive time $t_2$ to $t_3$ of the RX impedance pattern (in FIG. 8) has a maximum length without corrupting the data sample for each baud-rate with regard to the best timing characteristics of the ringing suppression circuit.

Although FIG. 9 is illustrated with a baudrate detector 910, it is envisaged that in other examples the baudrate detector 910 may be replaced with a serial-to-parallel interface (SPI) 905 configured to provide a pre-determined baudrate value to the impedance controller 432.

Figure 10:
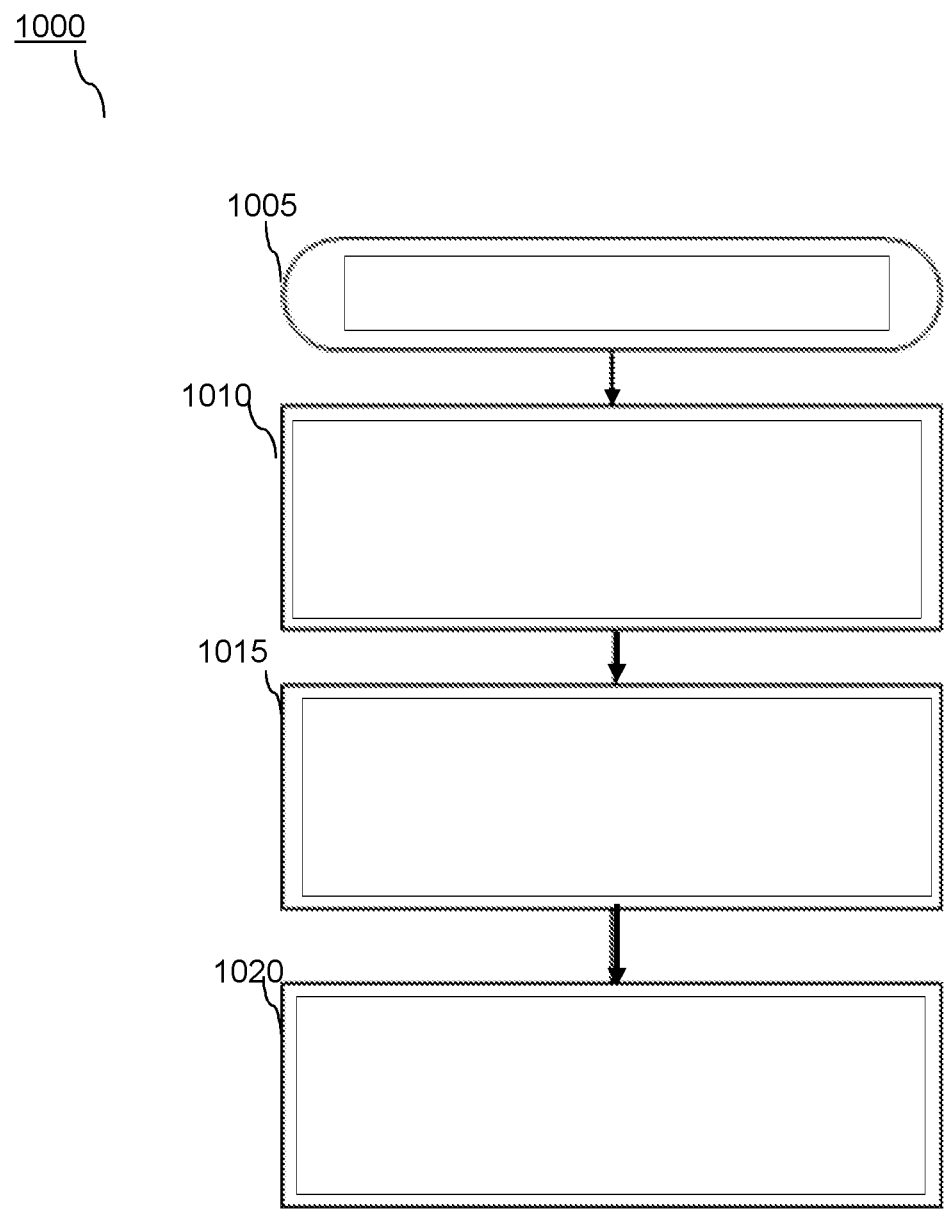
FIG. 10 illustrates a flowchart of an example method to suppress ringing in a CAN system, in accordance with some examples of the invention.

FIG. 10 illustrates a simplified flowchart 1000 of an example of a ringing suppression method for a CAN device, in accordance with example embodiments of the present invention. The simplified flowchart 1000 starts at 1005, with a power-on operation of the CAN controller (or CAN FD controller), say in a microcontroller, and a power on of the CAN device. At 1010, the flowchart includes a detection of a CAN baud rate. For example, the CAN FD controller transmits a data pattern on a TXD signal when the impedance controller 432 is in a recessive stage and the RXD signal output follows the TXD input signal. At 1015, the flowchart 1000 includes a configuration of a baudrate. In some examples, this includes introducing a timing adjustment of bit-time logic, for example in BTL circuit 765 in FIG. 7. In this phase, the impedance controller 432 is in a recessive stage and the RXD signal output is in a high logic state (i.e. recessive). At 1020 the CAN device returns to a normal mode of operation, whereby the TXD signal is input to the impedance controller 432 and the receiver output is the RXD output signal.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. In particular, examples of the invention may be employed for use in a standard CAN device for classical CAN systems or as a new CAN device for CAN FD systems in providing improved or optimized ringing suppression.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, circuits or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented that achieve the same functionality.

Any arrangement of components to achieve the same functionality is effectively 'associated', such that the desired functionality is achieved. Hence, any two components herein combined to achieve a particular functionality can be seen as being 'associated with' each other, such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations are merely illustrative. The multiple operations may be executed at least partially overlapping in time. Moreover, alternative example embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, examples of the invention are not limited to circuits implemented in non-programmable hardware but can also be applied in wireless programmable devices or circuits able to perform the desired device functions by operating in accordance with suitable program code. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A Controller Area Network, CAN, device, the CAN device comprising:
    a CAN transmitter connected to two CAN bus terminals of the CAN device;
    a receiver circuit operably coupled to the two CAN bus terminals of the CAN device; and
    a controller connected to the CAN transmitter, wherein the controller is configured to:
        determine whether the CAN device is operating as a transmitter node or a receiver node;
        detect a transition of the CAN device from a dominant state to a recessive state; and
        in response to both detecting a transition of the CAN device from the dominant state to the recessive state, and the determination of whether the CAN device is operating as a transmitter node or a receiver node, control an output impedance of the CAN transmitter to be within an impedance value range at the dominant state whilst a differential driver voltage on a CAN bus connected to the CAN device decreases to a predefined voltage.

2. The CAN device of claim 1, wherein the controller is an impedance controller and the transmitter is an impedance bridge.

3. The CAN device of claim 2, wherein the impedance controller connected to the CAN transmitter is configured to provide a control of the output impedance of the impedance bridge to be within a first predefined impedance value range in a feedforward manner when the CAN device is operating as a transmitter node and configured to provide a control of the output impedance of the impedance bridge to be within a second predefined impedance value range when the CAN device is operating as a receiver node.

4. The CAN device of claim 2, wherein the impedance bridge comprises two legs, and wherein each of the two legs comprises an adjustable pull circuit and an adjustable push circuit connected in series between a common voltage supply rail and a common ground rail and to each of the two CAN bus terminals.

5. The CAN device of claim 1, wherein the controller is further configured to:
    increase the output impedance of the CAN transmitter to be within a threshold of a range of a characteristic impedance of the CAN bus whilst the differential driver voltage on the CAN bus is maintained at a predefined voltage level; and
    subsequently, increase the output impedance of the CAN transmitter from the characteristic impedance of the CAN bus to a high ohmic value whilst the differential driver voltage on the CAN bus is maintained at the predefined voltage level.

6. The CAN device of claim 1, wherein the controller is further configured to increase the output impedance of the CAN transmitter to be within an impedance value range of a characteristic impedance of the CAN bus before a data sample point whilst a differential driver voltage on the CAN bus is maintained at the predefined voltage level.

7. The CAN device of claim 1 further comprising a time window filter circuit operably coupled to the receiver circuit and the controller and configured to determine whether the CAN bus voltage had been above a threshold for a period of time, and in response thereto provide an indication to the controller that the CAN device is operating as a receiver node.

8. The CAN device of claim 7 wherein the time window filter circuit is further configured to filter noise from a receive data signal from the receiver circuit.

9. The CAN device of claim 7 wherein the time window filter circuit is a window logic circuit coupled to a bit timing logic circuit configured to reject an output of the receiver circuit other than for a dominant to recessive transition.

10. The CAN device of any of claim 7 further comprising at least one of:
    a baudrate detector circuit configured to measure a bit rate employed by the CAN device and provide the measured bit rate to the controller;
    a serial-to-parallel interface, SPI, configured to provide a predetermined employed bit rate to the controller.

11. A Controller Area Network, CAN, comprising a CAN device according to any of claim 1.

12. A method for ringing suppression in a Controller Area Network, CAN, device, the method comprising:
    determining whether the CAN device is operating as a transmitter node or a receiver node;
    detecting a transition of the CAN device from a dominant state to a recessive state; and
    in response to detecting both a transition of the CAN device from the dominant state to the recessive state and the determination of whether the CAN device is operating as a transmitter node or a receiver node, controlling an output impedance of the CAN transmitter to be within an impedance value range whilst a differential driver voltage on a CAN bus connected to the CAN device decreases to a predefined voltage.

13. The method of claim 12, further comprising providing a control of the output impedance of a CAN transmitter to be within a first impedance value range in a feedforward manner when the CAN device is operating as a transmitter node and providing a control of the output impedance of the CAN transmitter to be within a second predefined range in a feedback manner when the CAN device is operating as a receiver node.

14. The method of claim 13, further comprising determining whether the CAN bus voltage had been above a threshold for a period of time, and in response thereto providing an indication to a controller that controls the output impedance of the CAN transmitter to be within the second predefined range when the CAN device is operating as a receiver node.

15. The method of claim 13, wherein the controller is an impedance controller and the transmitter is an impedance bridge.

* * * * *